(12) United States Patent
Wakaoka et al.

(10) Patent No.: US 10,973,151 B2
(45) Date of Patent: Apr. 6, 2021

(54) VAPOR CHAMBER

(71) Applicant: Murata Manufacturing Co., Ltd., Nagaokakyo (JP)

(72) Inventors: Takuo Wakaoka, Nagaokakyo (JP); Norikazu Kume, Nagaokakyo (JP); Haruhiko Ikeda, Nagaokakyo (JP); Osamu Nakao, Nagaokakyo (JP); Tatsuhiro Numoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/842,931

(22) Filed: Apr. 8, 2020

(65) Prior Publication Data
US 2020/0236810 A1 Jul. 23, 2020

Related U.S. Application Data

(63) Continuation of application No. 16/598,063, filed on Oct. 10, 2019, which is a continuation of application No. PCT/JP2017/017042, filed on Apr. 28, 2017.

(51) Int. Cl.
*H05K 7/20* (2006.01)
*F28D 15/04* (2006.01)
*H01L 23/427* (2006.01)

(52) U.S. Cl.
CPC ....... *H05K 7/20336* (2013.01); *F28D 15/046* (2013.01); *H01L 23/427* (2013.01)

(58) Field of Classification Search
CPC . F28D 15/0233; F28D 15/046; H01L 23/427; H05K 7/20366
See application file for complete search history.

(56) References Cited

U.S. PATENT DOCUMENTS

| | | | |
|---|---|---|---|
| 6,082,443 A | 7/2000 | Yamamoto et al. | |
| 2008/0210407 A1 | 9/2008 | Kim et al. | |
| 2009/0040726 A1 | 2/2009 | Hoffman et al. | |
| 2010/0221576 A1 | 9/2010 | Mihara et al. | |
| 2015/0330717 A1 | 11/2015 | Aoki et al. | |

FOREIGN PATENT DOCUMENTS

| | | | | |
|---|---|---|---|---|
| CN | 201706933 U | | 1/2011 | |
| JP | H1137679 A | | 2/1999 | |
| JP | 11330747 A | * | 11/1999 | ............. H01L 24/01 |
| JP | 2005121345 A | * | 5/2005 | ............. F28F 3/044 |
| JP | 2006351976 A | * | 12/2006 | |
| JP | 2012057841 A | | 3/2012 | |
| JP | 2013185774 A | * | 9/2013 | |
| JP | 2015015621 A | | 1/2015 | |
| JP | 2016050682 A | | 4/2016 | |
| WO | 2009044822 A1 | | 4/2009 | |
| WO | 2014115839 A1 | | 7/2014 | |

OTHER PUBLICATIONS

International Search Report issued for PCT/JP2017/017042, dated Jul. 25, 2017.
Written Opinion of the International Searching Authority issued for PCT/JP2017/017042, dated Jul. 25, 2017.

* cited by examiner

*Primary Examiner* — Eric S Ruppert
(74) *Attorney, Agent, or Firm* — Arent Fox LLP (57) ABSTRACT

A vapor chamber that includes a casing, a pillar in an internal space of the casing and that supports the casing from an inside thereof, a working fluid in the internal space of the casing, and recessed portions in at least a portion of a main external surface of the casing.

15 Claims, 5 Drawing Sheets

VAPOR CHAMBER

CROSS REFERENCE TO RELATED APPLICATIONS

The present application is a continuation of application Ser. No. 16/598,063, filed Oct. 10, 2019, which is a continuation of International application No. PCT/JP2017/017042, filed Apr. 28, 2017, the entire contents of each of which are incorporated herein by reference.

FIELD OF THE INVENTION

The present invention relates to a vapor chamber.

BACKGROUND OF THE INVENTION

In recent years, higher integration and higher performance of elements have caused an increase in heat generation. In addition, advances in miniaturization of products have caused increases in heat generation density and therefore the importance of measures for heat radiation have been increasing. This situation is particularly noticeable in the field of mobile terminals such as smartphones and tablets. Though graphite sheets or the like have been frequently used as members for measures to dissipate heat in recent years, the amount of heat transported thereby is insufficient and use of various members for measures to dissipate heat have been examined. In particular, the use of a vapor chamber that is a sheet-like heat pipe has been advanced for a reason that the vapor chamber may be capable of diffusing heat effectively to a great extent.

The vapor chamber is a closed tabular container in which an appropriate amount of volatile working fluid is sealed. The working fluid is vaporized by heat from a heat source, moves in an internal space, thereafter releases the heat to outside, and returns to liquid. The working fluid having returned to the liquid is carried again to a vicinity of the heat source by a capillary structure referred to as wick and is then vaporized afresh. Iteration of this process makes the vapor chamber operate autonomously without provision of an external power and thereby enables two-dimensional and high-speed diffusion of the heat with use of latent heat of vaporization and condensation of the working fluid.

In Patent Document 1, a heat pipe including a condensing portion where working fluid condenses and a vaporizing portion where the working fluid vaporizes is disclosed. According to Patent Document 1, the working fluid is sealed in a container of the heat pipe and a wick structure is formed on inner walls of the container, so that such two-dimensional diffusion of heat as described above is attained.

Patent Document 1: Japanese Unexamined Patent Application Publication No. 2012-057841.

SUMMARY OF THE INVENTION

For use of such a heat pipe as disclosed in Patent Document 1, the inside of the container and a heating portion are separated by container walls and jointing material that joints the container and a heating element. Currently, improvement in thermal coupling property between the container walls of the heat pipe and the heating element is demanded in order that thermal diffusion performance of the heat pipe may be further improved.

The present invention has been produced in consideration of above problems and aims at providing a vapor chamber with improved thermal coupling property between a heating element and the vapor chamber.

In order to solve the above problems, a vapor chamber according to an aspect of the present invention includes a casing, a pillar in an internal space of the casing and that supports the casing from an inside thereof, a working fluid in the internal space of the casing, and recessed portions in at least a portion of a main external surface of the casing.

A vapor chamber according to an embodiment further includes protruding portions in shapes corresponding to the recessed portions in the main external surface on at least a portion of a main internal surface of the casing.

In a vapor chamber according to an embodiment, the casing is composed of two sheets that have outer edge portions sealed and that are opposed to each other.

In a vapor chamber according to an embodiment, each of the two sheets includes recessed portions in at least a portion of an external surface thereof.

In a vapor chamber according to an embodiment, each of the two sheets include protruding portions in at least a portion of an internal surface thereof.

A vapor chamber according to an embodiment further includes at least one wick in the casing.

In a vapor chamber according to an embodiment, the at least one wick is interposed between the main internal surface of the casing and the pillar.

In a vapor chamber according to an embodiment, the at least one wick includes two wicks, a first of the two wicks is in contact with one main internal surface of the casing, and a second of the two wicks is in contact with a second main internal surface of the casing opposite the first main internal surface.

In a vapor chamber according to an embodiment, the recessed portions are each substantially shaped like a cylinder.

In a vapor chamber according to an embodiment, the recessed portions are each substantially shaped like a quadrangular pillar.

In a vapor chamber according to an embodiment, an equivalent circle diameter of each bottom surface of the recessed portions is 1 µm to 500 µm.

In a vapor chamber according to an embodiment, the recessed portions are grooves.

In a vapor chamber according to an embodiment, a first set of the grooves extend along a first direction and a second set of the grooves extend along a second direction different from the first direction.

In a vapor chamber according to an embodiment, the first direction is orthogonal to the second direction.

In a vapor chamber according to an embodiment, a width of each of the grooves is 1 µm to 500 µm.

In a vapor chamber according to an embodiment, a depth of each of the recessed portions is 1 µm to 100 µm.

In a vapor chamber according to an embodiment, a distance between adjoining recessed portions is 1 µm to 500 µm.

According to the invention, additionally, a heat radiation device that includes a heating element and the vapor chamber of the invention thermally coupled to the heating element by a jointing material that extends into the recessed portions of the casing is provided.

According to the invention, furthermore, electronic equipment including the vapor chamber of the invention or the heat radiation device of the invention is provided.

According to the present invention, the vapor chamber with the improved thermal coupling property in a joint portion between a container wall of a heat pipe and the jointing material and the heat radiation device and the electronic equipment that include the vapor chamber are provided.

DETAILED DESCRIPTION OF THE PREFERRED EMBODIMENTS

Hereinbelow, the present invention will be described in more detail with reference to the drawings.

FIG. 1 and FIGS. 3 to 8 are sectional views of vapor chambers 1a to 1g of the invention, respectively. As illustrated in FIG. 1 and FIGS. 3 to 8, the vapor chambers each include a casing 2 and pillars 3 that are placed in an internal space in the casing 2 so as to support the casing 2 from inside, and include recessed portions 9 in at least a portion of a main external surface of the casing 2. The vapor chambers each further include a working fluid sealed in the internal space of the casing 2, though the working fluid is not illustrated. Because the vapor chambers each include the recessed portions 9 in at least a portion of the main external surface of the casing 2 an anchor effect is produced between the casing 2 and jointing material 10 that joints the casing 2 and a heating element 11 as illustrated in FIG. 2, so that the casing 2 and the jointing material 10 may be tightly joined. In addition, the existence of the recessed portions 9 improves liquidity of the jointing material 10 at time of jointing and thus reduction in formation of a void in a joint portion and an increase in reliability after mounting may be attained.

As described above, the vapor chambers each include the recessed portions 9 in at least a portion of the main external surface of the casing 2 which enable tight jointing between the casing 2 and the jointing material 10 by the anchor effect, so that a high jointing force may be obtained even if the jointing material 10 that is used is small in amount. In comparison with vapor chambers that do not include the recessed portions 9, a reduction in the amount of the jointing material 10 that is used and resultant reduction in thermal resistance from the heating element 11 to the casing 2 are attained so that facilitation of transfer of heat of the heating element 11 to the internal space in the casing 2 may be attained. That is, improvement in thermal coupling property between the heating element 11 and the casing 2 may be attained, and a more effective thermal diffusion by the vapor chamber may be achieved.

In addition, since the vapor chambers each include the recessed portions 9 in at least a portion of the main external surface of the casing 2, an improvement in wet spread property of the jointing material 10 by capillarity enables use of the jointing material 10 having a wet spread property that would be insufficient for the jointing of a vapor chambers that did not include the recessed portions 9. That is, degrees of freedom for choices of a type of material of the casing 2 of the vapor chamber and choices of a type of the jointing material 10 are increased.

In addition, the existence of the recessed portions 9 improves the liquidity of the jointing material 10 at the time of the jointing, so that gas or the like that may have gotten into the jointing material 10 resists remaining between the casing 2 and the jointing material 10. Thus the formation of voids in the jointing material 10 after solidification of the jointing material 10 may be prevented, and the reliability after mounting may be increased.

The recessed portions 9 in at least a portion of the main external surface of the casing 2 create a larger surface area in comparison with a casing that does not include the recessed portions. Accordingly, absorption and radiation of heat between the internal space and outside of the casing 2 are effectively brought about and the vapor chambers of the invention consequently have a high heat absorption property and a high heat radiation property.

The recessed portions 9 in at least a portion of the main external surface of the casing 2 provide the casing with greater flexibility in comparison with a casing that does not include the recessed portions. Consequently, stresses having occurred in the casing 2 may be effectively made to escape to other portions and thus the vapor chambers of the invention are more resistant to damages in comparison with the vapor chambers not including the recessed portions 9.

Hereinbelow, configurations of the vapor chambers of the invention will be described in detail.

The casing 2 of the vapor chambers of the invention has only to include two main internal surfaces opposed to each other. The main internal surfaces of the casing 2 may have a polygonal shape or may have a circular shape. Herein, the main internal surfaces refer to a surface having the largest area and a surface opposed thereto among all surfaces that define the internal space in the casing 2.

Figure 1:
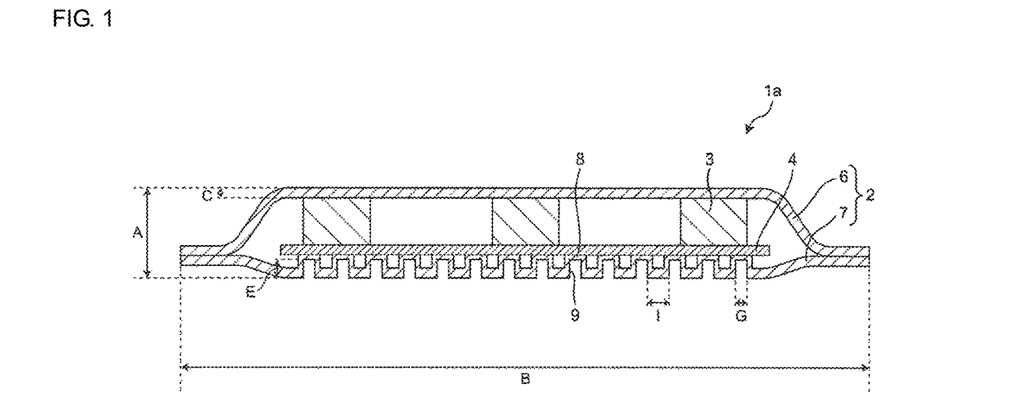
FIG. 1 is a sectional view of a vapor chamber according to an embodiment of the present invention.
Figure 2:
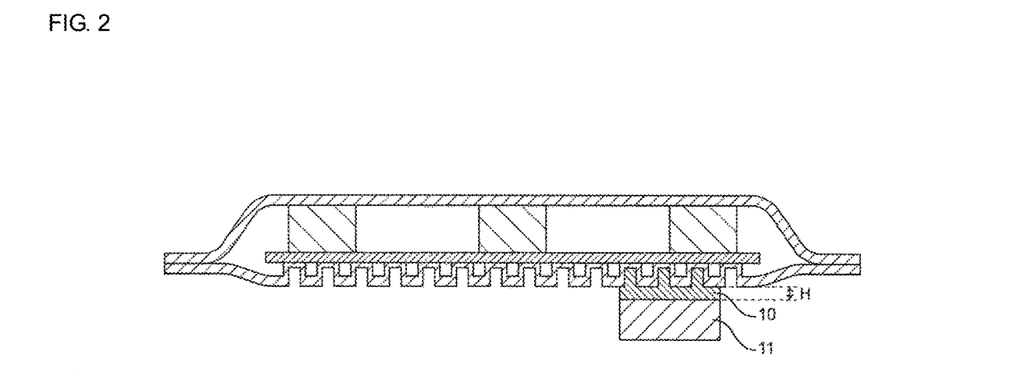
FIG. 2 is a sectional view of the vapor chamber of FIG. 1 that is jointed to a heating element.

A height A, which is denoted by A in FIG. 1, of the casing 2 (that is, a thickness of the vapor chamber) may be 100 μm to 600 μm, for instance, and is preferably in a range from 200 μm to 500 μm. A width B, which is denoted by B in FIG. 1, of the casing 2 (that is, a width of the vapor chamber) may be 5 mm to 500 mm, for instance, is preferably in a range from 20 mm to 300 mm, and is more preferably in a range from 50 mm to 200 mm. Though not illustrated, a depth D of the casing 2 that is orthogonal to an arrow designating the width B of the casing 2 in FIG. 1 and that is directed from front of the sheet to a depth (that is, a depth of the vapor chamber) may be 5 mm to 500 mm, for instance, is preferably in a range from 20 mm to 300 mm, and is more preferably in a range from 50 mm to 200 mm. The height A, the width B, and the depth D that have been described above may be uniform or may be different at any portion in the casing 2.

The casing 2 may be integrally formed of a single member or may be composed of two sheets that have outer edge portions sealed and that are opposed to each other, as illustrated in FIGS. 1 to 8, for instance. The casing 2 may be formed of two or more plate-like members. In the vapor chambers 1a to 1g of FIGS. 1 to 8, an upper casing sheet 6 forms the upper main internal surface of the casing 2 and a lower casing sheet 7 forms the lower main internal surface of the casing 2. In the casing 2, the upper casing sheet 6 and the lower casing sheet 7 are sealed against each other on the outer edge portions. The outer edge portions of the upper casing sheet 6 and the lower casing sheet 7 refer to regions extending inward from end portions of the sheets by a specified distance. In the vapor chambers of FIGS. 1 to 8, the outer edge portion of the upper casing sheet 6 and the outer edge portion of the lower casing sheet 7 may be sealed by laser welding, resistance welding, tungsten inert gas welding (TIG welding), diffusion bonding, brazing and soldering, plastic molding, ultrasonic bonding, and the like and may be preferably sealed by the laser welding or the resistance welding.

A shape of the casing 2 is not particularly limited. For instance, a planar shape (shape as seen looking from upper side in FIG. 1) of the casing 2 may be a polygonal shape such as triangle or rectangle, a circular shape, an oval shape, a shape into which above shapes are combined, or the like.

The material that forms the casing 2 is not particularly limited, but metal members made of Cu, Ni, Al, Mg, Ti, Fe, or the like, alloy members including above as principal components, and the like may be used, for instance, and Cu or Cu alloy is preferably used.

A thickness C, which is denoted by C in FIG. 1, of a wall constituting the casing 2 (a thickness of the casing sheet in an illustrated example) may be 10 μm to 200 μm, for instance, may be preferably in a range from 30 μm to 100 μm, and may be more preferably in a range from 40 μm to 60 μm. The thickness C described above may be uniform or may be different at any portion in the casing 2. For instance, the thickness C of the upper casing sheet 6 and a thickness of the lower casing sheet 7 may be different.

The casing 2 includes the recessed portions 9 in at least a portion of the main external surface. The recessed portions 9 may be formed by machining such as press, tool, or blasting or may be formed by surface treatment such as etching or plating, for instance. A method of forming the recessed portions 9 is not limited to methods described herein and any other method may be used.

Figure 3:
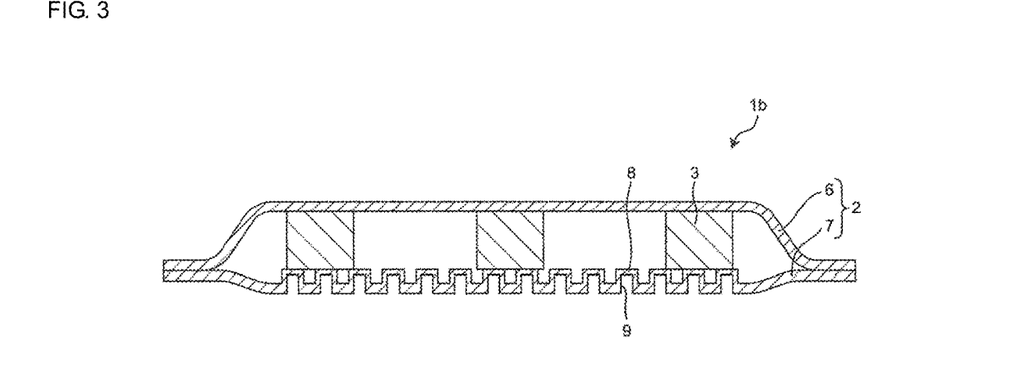
FIG. 3 is a sectional view of a vapor chamber according to an embodiment of the invention.
Figure 5:
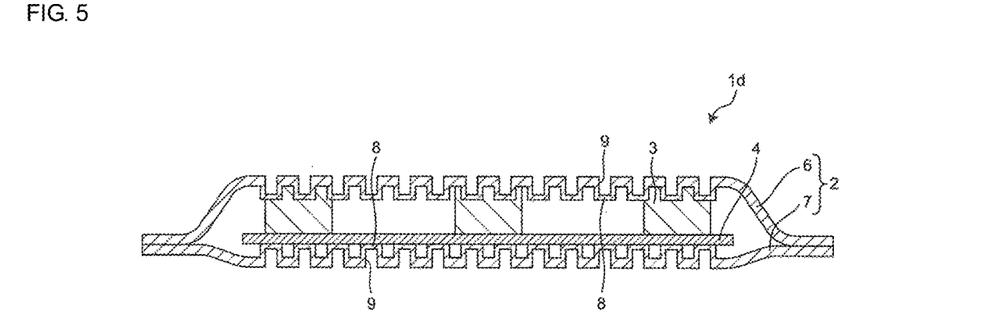
FIG. 5 is a sectional view of a vapor chamber according to an embodiment of the invention.
Figure 6:
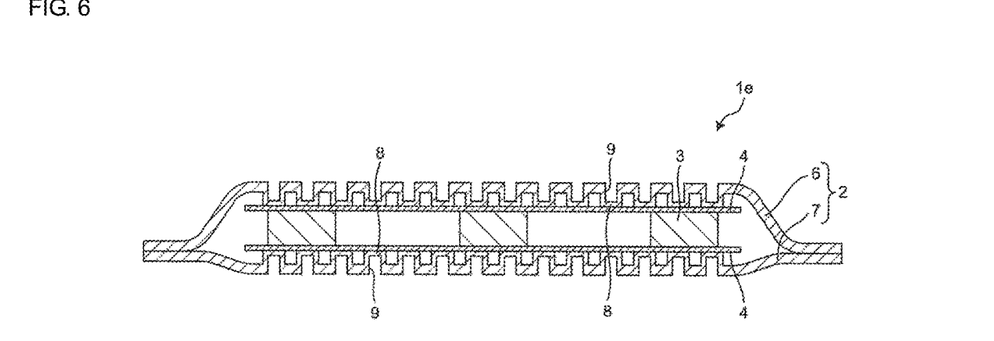
FIG. 6 is a sectional view of a vapor chamber according to an embodiment of the invention.

The recessed portions 9 may be formed in two or more portions of the main external surfaces of the casing 2. As illustrated in FIGS. 5 and 6, for instance, the recessed portions 9 may be formed in both the upper casing sheet 6 and the lower casing sheet 7. The recessed portions 9 may be provided with protruding portions 8 in shapes corresponding to the recessed portions 9, on the main internal surfaces opposed to the main external surfaces in which the recessed portions 9 exist, as illustrated in FIGS. 1 to 7, or may be provided with none of the protruding portions 8, as illustrated in FIG. 8. On condition that the protruding portions 8 in the shapes corresponding to the recessed portions 9 exist on the main internal surface opposed to the main external surface in which the recessed portions 9 exist, spaces between the protruding portions 8 on the main internal surface on which the protruding portions 8 exist may fulfil a role for back-flow of the working fluid. In the vapor chambers of the invention having the protruding portions 8, accordingly, the back-flow of the working fluid is facilitated by both a wick 4 and the spaces between the protruding portions 8, so that more efficient thermal diffusion may be brought about in comparison with the vapor chambers not including the protruding portions 8. In addition, existence of the spaces between the protruding portions 8 enables the back-flow of the working fluid through capillarity in the spaces, without use of the wick 4, as illustrated in FIG. 3.

Figure 4:
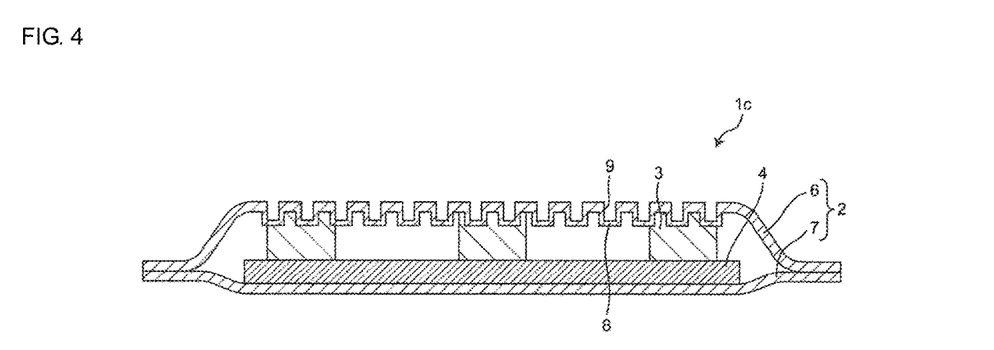
FIG. 4 is a sectional view of a vapor chamber according to an embodiment of the invention.

As illustrated in FIG. 4, the recessed portions 9 may be formed in one main external surface of the casing 2, the protruding portions 8 in the shapes corresponding to the recessed portions 9 may be formed on the main internal surface opposed to the one main external surface, and the wick 4 may be placed so as to be in contact with the main internal surface opposed to the main internal surface on which the protruding portions 8 are formed. In the vapor chamber of FIG. 4, the back-flow of the working fluid is facilitated by the spaces between the protruding portions 8 on a side of the one main internal surface and is facilitated by the wick 4 on a side of the other main internal surface opposed to the one main internal surface. Provision of such a structure in the vapor chamber of the invention causes an effect in which stresses at time of flexure are relaxed and an effect in which the heat radiation property is improved by an increase in the surface area.

As illustrated in FIG. 5, the recessed portions 9 may be formed in the two main external surfaces of the casing 2, the protruding portions 8 in the shapes corresponding to the recessed portions 9 may be formed on the two main internal surfaces opposed to the two main external surfaces, respectively, and the wick 4 may be placed on only one side of the main internal surfaces on which the protruding portions 8 are formed. In the vapor chamber of FIG. 5, the back-flow of the working fluid is facilitated by the spaces between the protruding portions 8 and the wick 4 on the side of the main internal surface and is facilitated by only the spaces between the protruding portions 8 on the side of the other main internal surface opposed to the one main internal surface. Provision of such a structure in the vapor chamber of the invention causes the effect in which the stresses at the time of the flexure are relaxed and the effect in which the heat radiation property is improved by the increase in the surface area.

As illustrated in FIG. 6, the recessed portions 9 may be formed in the two main external surfaces of the casing 2, the protruding portions 8 in the shapes corresponding to the recessed portions 9 may be formed on the two main internal surfaces opposed to the two main external surfaces, respectively, and the wicks 4 may be placed on both the sides of the two main internal surfaces on which the protruding portions 8 are formed. In the vapor chamber of FIG. 6, the back-flow of the working fluid is facilitated by the spaces between the protruding portions 8 and by the wicks 4 on both the sides of the two main internal surfaces. Provision of such a structure in the vapor chamber of the invention causes the effect in which the stresses at the time of the flexure are relaxed and the effect in which the heat radiation property is improved by the increase in the surface area.

As illustrated in FIG. 2, the recessed portions 9 form a hollow portion that may be filled with the jointing material 10. A proportion of a volume of the hollow portion to a volume of a portion of the casing 2 in which the recessed portions 9 are formed may be 1% to 99%, for instance, and is preferably in a range from 10% to 70%. The proportion of the volume of the hollow portion in such a range enables effective reduction in an amount of the jointing material 10 that is required for the jointing of the casing 2 to the heating element 11, in comparison with an amount of jointing material that is required for jointing of a casing not including the recessed portions 9. The thermal resistance in the thermal coupling may be greatly decreased by the reduction in the amount of the jointing material 10. In addition, a property of close contact with a thermal coupling member such as solder or thermal interface material may be improved by the anchor effect. Solder voids may be reduced because wet spread of the thermal coupling member is facilitated by a capillary pressure. Reliability for the thermal coupling is easily ensured because an area of the jointing to the solder is increased.

Figure 7:
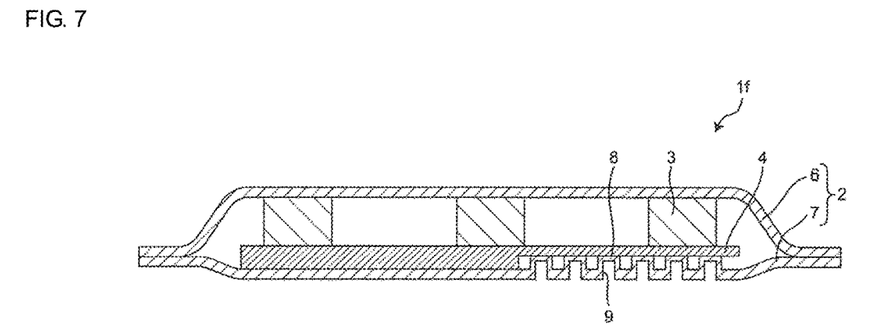
FIG. 7 is a sectional view of a vapor chamber according to an embodiment of the invention.
Figure 8:
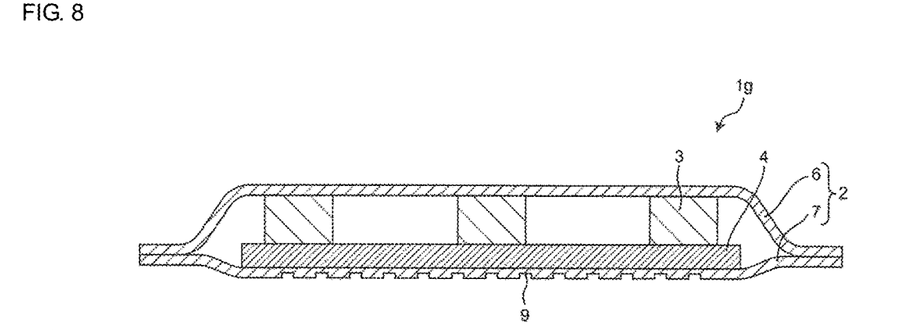
FIG. 8 is a sectional view of a vapor chamber according to an embodiment of the invention.

The recessed portions 9 may be formed in the whole one main surface on an outer side portion of the casing 2, as illustrated in FIGS. 1 to 6 and FIG. 8, or may be formed partially on the one main surface on the outer side portion of the casing 2, as illustrated in FIG. 7. By partial formation of the recessed portions 9 in the one main surface on the outer side portion of the casing 2, as illustrated in FIG. 7, improvement in the coupling between the heating element and a thermal coupling portion in the recessed portions and the protruding portions and rigidity to be attained by smooth casing surfaces may be simultaneously satisfied. In addition, effects of partial relaxation of the stresses and improvement in the heat radiation property due to the increase in the surface area are expected.

A width G, which is denoted by G in FIG. 1, of the recessed portions 9 in the main external surface of the casing 2 may be 1 µm to 500 µm, is preferably in a range from 5 µm to 300 µm, and is more preferably in a range from 15 µm to 150 µm. The recessed portions 9 having the width G result in increase in capillary force and decrease in transmittance and may thus increase an auxiliary effect on a function of the wick for the back-flow of the working fluid. A depth E, which is denoted by E in FIG. 1, of the recessed portions 9 may be 1 µm to 100 µm, is preferably in a range from 5 µm to 50 µm, and is more preferably in a range from 15 µm to 30 µm. The recessed portions 9 of the casing 2 having the depth E result in increase in the capillary force and decrease in the transmittance and may thus increase the auxiliary effect on the function of the wick for the back-flow of the working fluid.

Distances I, which are denoted by I in FIG. 1, between adjoining ones of the recessed portions 9 include a distance from 1 µm to 500 µm, preferably a distance from 5 µm to 300 µm, or more preferably a distance from 15 µm to 150 µm. It is more preferable that all the distances I, which are denoted by I in FIG. 1, between the adjoining ones of the recessed portions 9 be from 1 µm to 500 µm. The distances between adjoining ones of the recessed portions 9 whose distances are from 1 µm to 500 µm may result in the satisfactory effects of the improvement in the coupling between the heating element and the thermal coupling portion, the stress relaxation, and the improvement in the heat radiation property by the increase in the surface area.

In the invention, adjoining of the recessed portions 9 means adjoining without interposition of other recessed portions 9.

Figure 9:
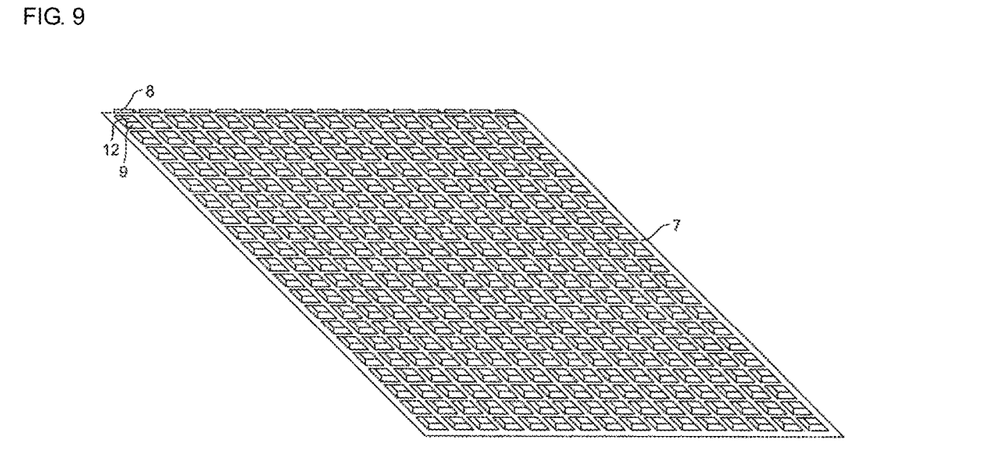
FIG. 9 is a lower-side perspective view of a main surface of a vapor chamber according to an embodiment of the invention.
Figure 10:
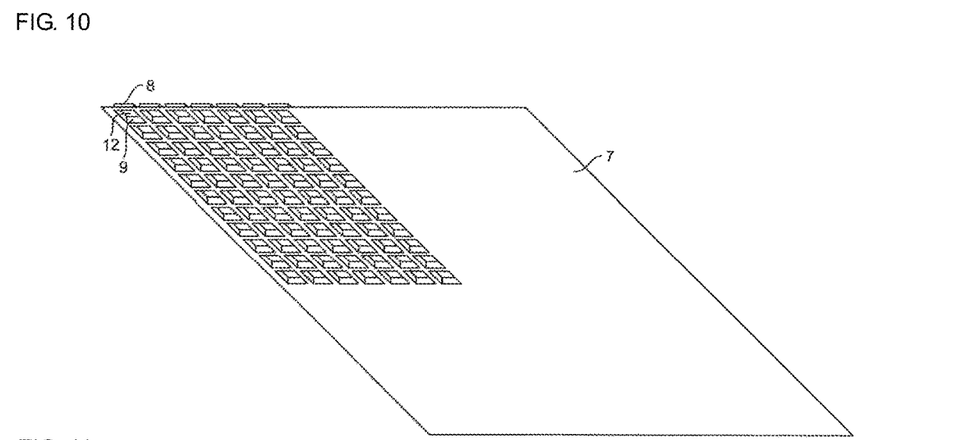
FIG. 10 is a lower-side perspective view of a main surface of a vapor chamber according to an embodiment of the invention.
Figure 11:
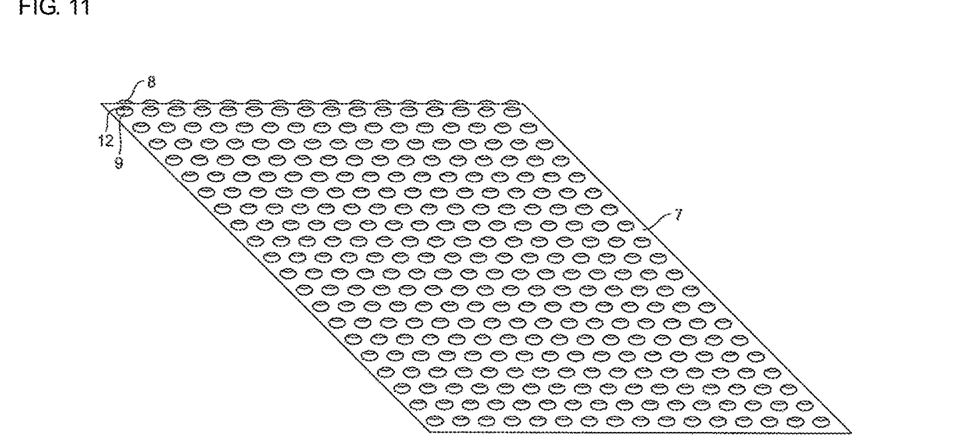
FIG. 11 is a lower-side perspective view of a main surface of a vapor chamber according to an embodiment of the invention.
Figure 15:
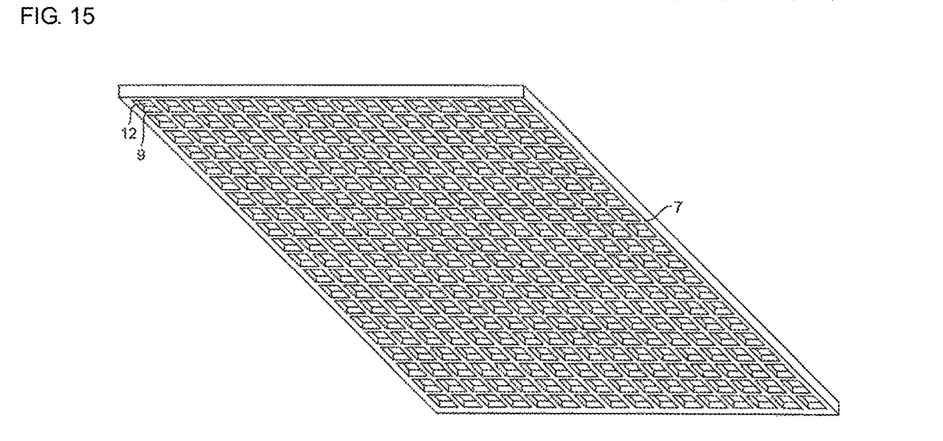
FIG. 15 is a lower-side perspective view of a main surface of a vapor chamber according to an embodiment of the invention.

The recessed portions 9 of the casing 2 may be formed into any shape that results in formation of hollow portions which may be filled with the jointing material 10. Preferably, the recessed portions 9 of the casing 2 are each shaped like a pillar having bottom surfaces that are parallel and opposed to each other. That is, the hollow portions of the recessed portions 9 are each shaped like the pillar having the bottom surfaces that are parallel and opposed to each other. The recessed portions 9 of the casing 2 may be each substantially shaped like a quadrangular pillar as illustrated in FIGS. 9 and 10, for instance. Though the casing 2 has the protruding portions 8 in shapes corresponding to the recessed portions 9, on the main internal surface opposed to the main external surface in which the recessed portions 9 exist, in FIGS. 9 and 10, the casing 2 may lack the protruding portions 8, as illustrated in FIG. 15. The recessed portions 9 of the casing 2 may be each substantially shaped like a cylinder as illustrated in FIG. 11 or may be each shaped like a frustum, though not illustrated. An equivalent circle diameter of bottom surfaces 12 of the recessed portions 9 may be 1 µm to 500 µm, is preferably in a range from 5 µm to 300 µm, and is more preferably in a range from 15 µm to 150 µm. The bottom surfaces 12 of the recessed portions 9 of the casing 2 having such an equivalent circle diameter result in formation of the hollow portions having a sufficient volume and increase in an amount of the jointing material 10 to be filled in, so that a thickness H of the joint portion may be effectively reduced. Herein, the equivalent circle diameter of the bottom surface 12 refers to a diameter of a true circle having an area equivalent to an area of the bottom surface.

Figure 12:
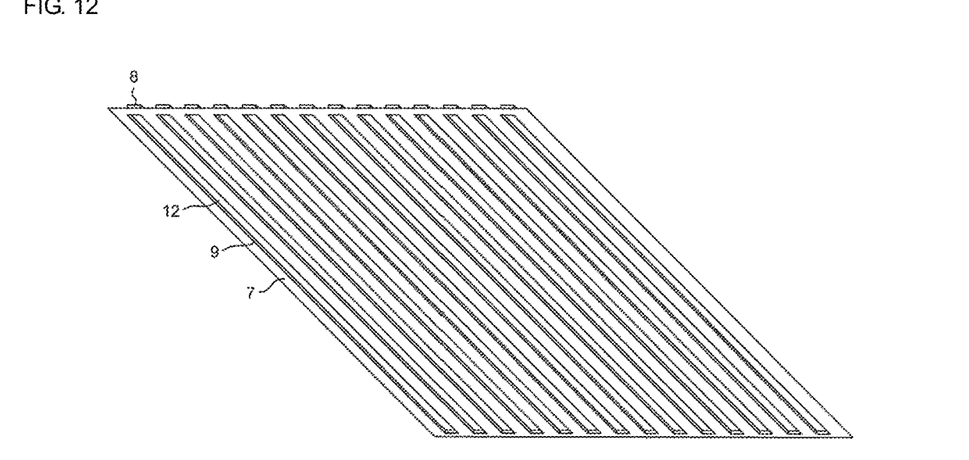
FIG. 12 is a lower-side perspective view of a main surface of a vapor chamber according to an embodiment of the invention.
Figure 13:
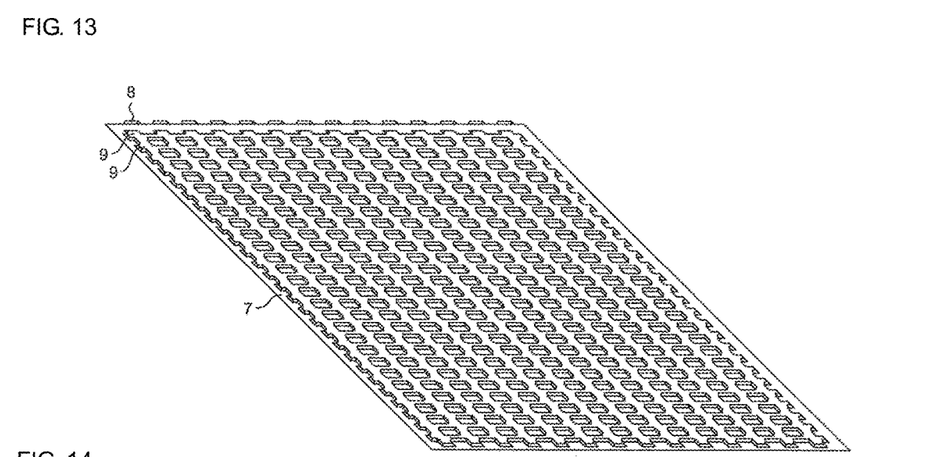
FIG. 13 is a lower-side perspective view of a main surface of a vapor chamber according to an embodiment of the invention.

The recessed portions 9 of the casing 2 may be such grooves as illustrated in FIGS. 12 and 13. The recessed portions 9 that are the grooves may be all formed along one direction, as illustrated in FIG. 12, or some of the grooves may be formed along a first direction and the others may be formed along a second direction, as illustrated in FIG. 13. The recessed portions 9 that are the grooves and that are formed along the two directions enable reduction in the amount of the jointing material 10 at the time of the jointing. In addition, the property of close contact with the thermal coupling member such as solder or thermal interface material may be improved by the anchor effect. Furthermore, solder voids may be effectively allowed to escape. In addition, the solder voids may be reduced because the wet spread of the thermal coupling member is facilitated by capillary pressure. Furthermore, the reliability for the thermal coupling is easily ensured because the area of the jointing with the solder is increased. Besides, the casing is made resistant to flexure. Moreover, the heat radiation property is improved by the increase in the surface area.

As illustrated in FIG. 13, the first direction may be orthogonal to the second direction. The recessed portions 9 that are the grooves and that are formed along the two directions intersecting at 90 degrees enable effective escape of the solder voids.

Figure 14:
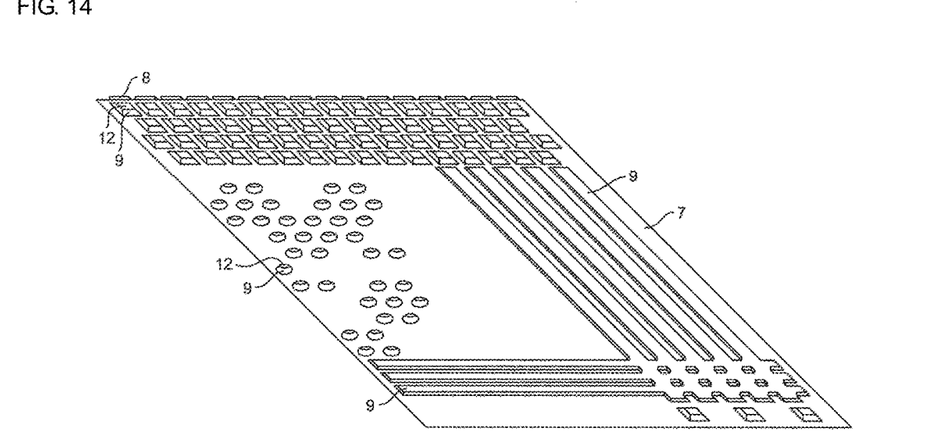
FIG. 14 is a lower-side perspective view of a main surface of a vapor chamber according to an embodiment of the invention.

In the vapor chambers of the invention, some of the recessed portions 9 may be grooves and the others of the recessed portions 9 may have other shapes. For instance, the vapor chambers of the invention may include the recessed portions 9 that are in shapes of a quadrangular pillar and a cylinder and the recessed portions 9 that are grooves, as illustrated in FIG. 14.

The pillars 3 are placed in the casing 2 so as to support the casing 2 from the inside. Though the pillars 3 have a cylindrical shape in the vapor chambers of FIGS. 1 to 8, the shape of the pillars 3 is not limited thereto and a shape like a pillar having two bottom surfaces may be used. As the shape of the pillars 3, any shape such as a cylindrical shape, a prismatic shape, and a shape like a frustum may be used. When one of the bottom surfaces of each of the pillars 3 is in contact with the wick 4 and the other is not in contact with the wick 4, pressures exerted on the wick 4 may be effectively reduced by excess in area of the one bottom surface in contact with the wick 4 over another bottom surface. The pillars 3 may be fixed to the casing 2. When the bottom surfaces of the pillars 3 are in contact with the wick 4, the pillars 3 may be fixed to the wick 4.

Though a thickness of the pillars 3 is not particularly limited as long as the thickness results in a strength that may suppress deformation of the casing 2 of the vapor chamber, an equivalent circle diameter of a section of the pillars 3 that is perpendicular to a direction of height of the pillars 3 may be 100 μm to 2000 μm, for instance, is preferably in a range from 300 μm to 1000 μm, and is more preferably in a range from 500 μm to 800 μm. By increase in the equivalent circle diameter of the pillars 3, the deformation of the casing 2 of the vapor chamber may be even more greatly suppressed. With a decrease in the equivalent circle diameter of the pillars 3, by contrast, a broader space for movement of vapor of the working fluid may be ensured. The pillars 3 preferably have a height that is 0.08 times to 0.9 times the height A of the casing 2 and may have a height from 50 μm to 500 μm, for instance, preferably in a range from 100 μm to 400 μm, and more preferably in a range from 100 μm to 200 μm.

Material that forms the pillars 3 is not particularly limited, but metal members made of Cu, Ni, Al, Mg, Ti, Fe, or the like, alloy members including above as principal components, and the like may be used, for instance, and Cu or Cu alloy is preferably used. In a preferable aspect, the material that forms the pillars is the same as material of either or both of a first sheet and a second sheet.

A number of the pillars 3 placed in the internal space in the casing 2 may be 0.125 to 0.5 per 1 $mm^2$, for instance, and is preferably in a range from 0.15 to 0.35 per 1 $mm^2$. The number of the pillars 3 in such a range may result in more effective support for the casing 2 and increase in resistance against collapse of the casing 2. The pillars 3 may be placed at equal intervals as illustrated in FIGS. 1 to 8 and, for instance, may be placed on lattice points so that distances between the pillars 3 may be made uniform, or may be placed at unequal intervals. Equal placement of the pillars 3 ensures uniform strength across the vapor chamber.

A proportion of a sum of areas of the bottom surfaces of the pillars 3 that are placed in the internal space in the casing 2 and that are in contact with the main internal surface of the casing 2 to an area of the main internal surface of the casing 2 may be 1% to 70%, for instance, and is preferably in a range from 5% to 50%.

The pillars 3 may be integrally formed with the casing 2 or may be produced separately from the casing 2 and may be thereafter fixed to specified portions in the casing 2.

The wick 4 is not particularly limited as long as the wick 4 has a structure that enables movement of the working fluid through agency of the capillary force. A capillary structure that exerts the capillary force to move the working fluid is not particularly limited and may be a publicly known structure that is used in a conventional vapor chamber. As the capillary structure, for instance, microstructures having unevenness such as pores, grooves, or protrusions, for instance, fiber structures, groove structures, mesh structures, and the like may be used.

Though a size and a shape of the wick 4 are not particularly limited, the wick 4 preferably has the size and the shape that allow continuous placement of a vaporizing portion to a condensing portion in the casing, for instance.

In the vapor chambers of the invention that are illustrated in FIG. 1 and FIGS. 4 to 8, the wick 4 has two opposed main surfaces and at least one wick 4 is placed in the internal space in the casing 2 in order to ensure the back-flow of the working fluid. At least a portion of the wick 4 is stacked on the upper casing sheet 6 or the lower casing sheet 7 and is further held between the main internal surface of the casing 2 and the pillars 3.

A thickness of the wick 4 may be in a range from 5 μm to 200 μm, for instance, is preferably in a range from 10 μm to 80 μm, and is more preferably in a range from 30 μm to 50 μm. The thickness of the wick 4 may be uniform at any portion in the wick 4 or may be different as illustrated in FIG. 7. The wick 4 does not have to be formed on the whole main surface of the casing 2 of the vapor chamber as illustrated in FIG. 1 and FIGS. 4 to 8 and may be partially formed.

Material of the wick 4 is not particularly limited, but porous material, mesh, sintered body, nonwoven fabric, or the like may be used, for instance, and mesh or nonwoven fabric is preferably used. The porous material that is to be the material of the wick 4 may be made of metallic porous material, ceramic porous material, resin porous material, or the like, for instance. The mesh that is to be the material of the wick 4 may be made of metal mesh, resin mesh, or those types of mesh with surface coat, for instance, and is preferably made of copper mesh, SUS mesh, or polyester. The sintered body that is to be the material of the wick 4 may be made of metallic porous sintered body or ceramic porous sintered body, for instance, and is preferably made of porous sintered body of copper, nickel, or the like. The structures described above in relation to the invention reduce the pressures exerted on the wick 4 and thus allow use of a wick, as the wick 4, having strength insufficient for use in a conventional vapor chamber.

Though not illustrated in FIGS. 1 to 8, the working fluid is further sealed in the casing 2 of the vapor chambers of the invention. The working fluid is vaporized by heat from the heating element 11 so as to become vapor. After that, the working fluid having become the vapor moves in the casing 2, releases the heat, and returns to liquid. The working fluid having returned to the liquid is carried again toward the heat source by the capillarity in the wick 4. Then the working fluid is vaporized afresh by heat from the heat source so as to become vapor. Iteration of this process makes the vapor chambers of the invention operate autonomously without necessity for an external power and may thereby bring about two-dimensional and prompt diffusion of heat with use of latent heat of vaporization and condensation of the working fluid.

A type of the working fluid is not particularly limited, but water, alcohols, CFC substitute, or the like may be used, for instance, and water is preferably used.

The vapor chambers of the invention may be installed in or on a heat radiation device so as to be close to a heat source. Accordingly, the invention also provides the heat radiation device including the vapor chamber of the invention. Provision of the vapor chamber of the invention in or on the heat radiation device of the invention enables effective suppression of temperature increase in electronic components generating heat and vicinities of the components.

The vapor chambers or the heat radiation device of the invention may be installed in or on electronic equipment in order to carry out heat radiation. Accordingly, the invention provides the electronic equipment including the vapor chamber or the heat radiation device of the invention. As the electronic equipment of the invention, smartphone, tablet terminal, notebook computer, game machine, wearable device, and the like may be enumerated, for instance. As described above, the vapor chambers of the invention may operate autonomously without necessity for external power and may bring about the two-dimensional and high-speed diffusion of heat with use of the latent heat of vaporization and condensation of the working fluid. Accordingly, provision of the vapor chamber or the heat radiation device of the invention in or on the electronic equipment may effectively bring about the heat radiation in a limited space in the electronic equipment.

The vapor chambers, the heat radiation device, and the electronic equipment of the invention may be used for a wide range of applications in fields of personal digital assistant and the like. For instance, those may be used for decrease in temperatures of heat sources such as CPU and resultant extension of usable time of the electronic equipment and may be used for smartphones, tablets, notebook PCs, and the like.

REFERENCE SIGNS LIST 1a vapor chamber
1b vapor chamber
1c vapor chamber
1d vapor chamber
1e vapor chamber
1f vapor chamber
1g vapor chamber
2 casing
3 pillar
4 wick
6 upper casing sheet
7 lower casing sheet
8 protruding portion
9 recessed portion
10 jointing material
11 heating element
A height of casing 2
B width of casing 2
C thickness of wall constituting casing 2
D depth of casing 2
E depth of recessed portion 9
G width of recessed portion 9
H thickness of joint portion
I distance between adjoining recessed portions

The invention claimed is:

1. A vapor chamber comprising:
a casing having first and second opposed sheets that are sealed together and define an internal space, the first sheet having a main external surface, at least a portion of the main external surface having a plurality of recessed portions and a plurality of flat portions arranged alternately with the plurality of recessed portions;
a plurality of pillars in the internal space of the casing and positioned so as to support the casing from inside thereof, at least one pillar of the plurality of pillars having a surface overlapping at least one recessed portion of the plurality of recessed portions and at least one flat portion of the plurality of flat portions in a plan view of the vapor chamber, and the surface having a shape conforming to that of the at least one flat portion and to that of the at least one recessed portion overlapping with the surface; and
a working fluid in the internal space of the casing.

2. The vapor chamber according to claim 1, wherein the plurality of flat portions extend orthogonal to a depth direction of an adjacent recessed portion of the plurality of recessed portions.

3. The vapor chamber according to claim 1, wherein at least a second flat portion of the plurality of flat portions is positioned between adjacent pillars of the plurality of pillars in the plan view of the vapor chamber.

4. The vapor chamber according to claim 1, wherein the casing further has a main internal surface opposing the main external surface, at least a portion of the main internal surface opposite to the recessed portions having protruding portions.

5. The vapor chamber according to claim 1, wherein the main external surface is a first main external surface, and the plurality of recessed portions are first recessed portions, a first of the two opposed sheets includes the first recessed portions, a second of the two opposed sheets forms a second main external surface, at least a portion of the second main external surface having at least one second recessed portion.

6. The vapor chamber according to claim 5, wherein the first of the two opposed sheets further has a first main internal surface opposing the first main external surface, at least a portion of the first main internal surface opposite to the first recessed portions having first protruding portions, and wherein the second of the two opposed sheets forms a second main internal surface, at least a portion of the second main internal surface opposite to the second recessed portions having second protruding portions.

7. The vapor chamber according to claim 1, further comprising at least one wick in the internal space of the casing.

8. The vapor chamber according to claim 7, wherein the at least one wick is interposed between a main internal surface of the casing and the plurality of pillars.

9. The vapor chamber according to claim 7, wherein the at least one wick includes two wicks, a first of the two wicks in contact with a first main internal surface of the casing, and a second of the two wicks in contact with a second main internal surface of the casing opposite the first main internal surface.

10. The vapor chamber according to claim 1, wherein the at least one recessed portion is shaped like a quadrangular pillar.

11. The vapor chamber according to claim 1, wherein an equivalent circle diameter of a bottom surface of the at least one recessed portion is 1 μm to 500 μm.

12. The vapor chamber according to claim 1, wherein the at least one recessed portion is a groove.

13. The vapor chamber according to claim 8, wherein a width of the groove is 1 μm to 500 μm.

14. The vapor chamber according to claim 1, wherein a depth of the at least one recessed portion is 1 μm to 200 μm.

15. The vapor chamber according to claim 1, wherein the main external surface is a first main external surface configured as a heat radiation surface, at least a portion of the first main external surface of the first sheet having the at least one recessed portion, the second sheet having a second main external surface configured as a heat absorption surface, and at least a second recessed portion of the plurality of recessed portions is positioned between adjacent pillars of the plurality of pillars in the plan view of the vapor chamber.

* * * * *